(12) United States Patent
Samaan et al.

(10) Patent No.: US 11,592,788 B2
(45) Date of Patent: Feb. 28, 2023

(54) ENHANCED DYNAMIC CONTINGENCY ANALYSIS FOR POWER SYSTEMS

(71) Applicant: BATTELLE MEMORIAL INSTITUTE, Richland, WA (US)

(72) Inventors: Nader A. Samaan, Richland, WA (US); Bharat GNVSR Vyakaranam, Redmond, WA (US); Jeffery E. Dagle, Richland, WA (US); Yousu Chen, Mount Pleasant, SC (US); Marcelo A. Elizondo, Seattle, WA (US); Mallikarjuna R. Vallem, Richland, WA (US); Pavel V. Etingov, Mukilteo, WA (US); Qiuhua Huang, Richland, WA (US); Xinya Li, Ithaca, NY (US); Blaine J. McGary, Pasco, WA (US); Kirsten L. Pierce, Richland, WA (US); George Chin, Jr., Richland, WA (US); Dimitri V. Zarzhitsky, Everett, WA (US)

(73) Assignee: Battelle Memorial Institute, Richland, WA (US)

(*) Notice: Subject to any disclaimer, the term of this patent is extended or adjusted under 35 U.S.C. 154(b) by 457 days.

(21) Appl. No.: 16/827,695

(22) Filed: Mar. 23, 2020

(65) Prior Publication Data
US 2021/0294277 A1  Sep. 23, 2021

(51) Int. Cl.
*G01R 19/25* (2006.01)
*G05B 17/00* (2006.01)
(Continued)

(52) U.S. Cl.
CPC ......... *G05B 13/02* (2013.01); *G01R 19/2513* (2013.01); *G05B 15/02* (2013.01);
(Continued)

(58) Field of Classification Search
CPC ........ G05B 13/02; G05B 15/02; G05B 17/00; G05B 23/0283; H02J 3/001; G01R 19/2513; G06Q 10/0635
(Continued)

(56) References Cited

U.S. PATENT DOCUMENTS

2018/0129768 A1* 5/2018 Enenkel ................ G06F 30/367

FOREIGN PATENT DOCUMENTS

CN          106709641 A  *  5/2017 ......... G06Q 10/0635

OTHER PUBLICATIONS

Samaan et al "Modeling of protection in dynamic simulation using generic relay models and settings" Published in: Jul. 17-21, 2016 IEEE Power and Energy Society General Meeting (PESGM) (Year: 2016).*

(Continued)

*Primary Examiner* — John E Johansen
(74) *Attorney, Agent, or Firm* — Colby Nipper PLLC (57) ABSTRACT

The present disclosure describes systems and techniques that enhance effectiveness and efficiency of a contingency analysis tool that is used for studying the magnitude and likelihood of extreme contingencies and potential cascading events across a power system. The described systems and techniques include deploying the contingency analysis tool in a high-performance computing (HPC) environment and incorporating visual situational awareness approaches to allow power system engineers to quickly and efficiently evaluate multiple power system simulation models. Furthermore, the described systems and techniques include the power system contingency-analysis tool calculating and coordinating protection element settings, as well as assessing controls of the power system using small-signal nomograms, allowing power system engineers to more effectively (Continued)

comprehend, evaluate, and analyze causes and effects of cascading events against a topology of a power system.

21 Claims, 6 Drawing Sheets (51) Int. Cl.
G05B 13/02 (2006.01)
G05B 23/02 (2006.01)
G05B 15/02 (2006.01)
G06Q 10/06 (2012.01)
H02J 3/00 (2006.01)
G06Q 10/0635 (2023.01)

(52) U.S. Cl.
CPC ......... *G05B 17/00* (2013.01); *G05B 23/0283* (2013.01); *G06Q 10/0635* (2013.01); *H02J 3/001* (2020.01)

(58) Field of Classification Search
USPC .......................................................... 703/18
See application file for complete search history.

(56) References Cited

OTHER PUBLICATIONS

Morison et al "Power system security assessment" Published in: IEEE Power and Energy Magazine (vol. 2, Issue: 5, Sep.-Oct. 2004. pp. 30-39 (Year: 2004).*
Chen, et al., "A Generic Advanced Computing Framework for Executing Windows-based Dynamic Contingency Analysis Tool in Parallel on Cluster Machines", Aug. 2020, 5 pages.
Chin, et al., "A Dynamic Contingency Analysis Visualization Tool", Aug. 2020, 5 pages.
Fan, et al., "Bulk Electric System Protection Model Demonstration with 2011 Southwest Blackout in DCAT", Aug. 2020, 5 pages.
He, et al., "Small-Signal Stability Analysis for Power System Frequency Regulation with Renewable Energy Participation", Apr. 5, 2021, 13 pages.
Samaan, et al., "Dynamic Contingency Analysis Tool—Phase 1", Nov. 2015, 196 pages.
Samaan, et al., "Dynamic Contingency Analysis Tool (DCAT) User Manual with Test System Examples", Jan. 2017, 74 pages.
Vyakaranam, et al., "Database Management Module Framework for Dynamic Contingency Analysis and Visualization", Aug. 2020, 5 pages.

* cited by examiner

ENHANCED DYNAMIC CONTINGENCY ANALYSIS FOR POWER SYSTEMS

STATEMENT AS TO RIGHTS TO DISCLOSURES MADE UNDER FEDERALLY-SPONSORED RESEARCH AND DEVELOPMENT

This disclosure was made with Government support under Contract DE-00576RL01830 awarded by the U.S. Department of Energy. The Government has certain rights in the invention.

BACKGROUND

In a power system, such as a bulk electric power grid, a "contingency" is when an element of the power system fails. The element may be, for example, a generator, a transmission line, or a shunt. During an extreme event such as a hurricane, earthquake, or cyber-attack, certain contingency combinations might lead to cascading operations. Cascading is a sequential disconnection of other elements within the power system, leading to a partial or complete blackout that could leave thousands of electricity consumers without electric power.

These large blackouts have extensive effects on citizens, businesses, the economy, and the government. While such blackouts are rare, they pose a substantial risk to the security and economic health of a country. Much is known about avoiding the first few failures near the beginning of a cascade, but there is a lack of established systems and methods for directly analyzing risks and consequences of the longer chains of component outages.

In recent years, systems and methods have been developed to improve capabilities of power-planning engineers to assess the magnitude and likelihood of extreme contingencies and potential cascading events across their systems and interconnections. Examples of such systems and methods include power system contingency-analysis tools.

Power system contingency-analysis tools available today, however, have drawbacks that impact a power-planning engineer's ability to effectively and efficiently study the process of cascading outages in a power system. As a first example, steady-state and transient simulations by power system planning and analysis tools with which the power system contingency-analysis tool interfaces may require extensive computing power and be inherently slow to compute power system simulation results. As a second example, data associated with the power system simulation results may be difficult for a power-planning engineer to aggregate and interpret. As a third example, parameters needed to accurately simulate protection elements in the power system, such as relay configurations, may not be available to a power-planning engineer. And, as a fourth example, small-signal instabilities that are introduced into the power system during component outages and that exacerbate cascading outages are difficult to predict and simulate.

SUMMARY

The present disclosure describes systems and techniques that enhance effectiveness and efficiency of a contingency analysis tool that is used for studying the magnitude and likelihood of extreme contingencies and potential cascading events across a power system. The described systems and techniques include deploying the contingency analysis tool in a high-performance computing (HPC) environment and incorporating visual situational awareness approaches to allow power system engineers to quickly and efficiently evaluate multiple power system simulation models. Furthermore, the described systems and techniques include the power system contingency-analysis tool calculating and coordinating protection element settings, as well as assessing controls of the power system using small-signal nomograms, allowing power system engineers to more effectively comprehend, evaluate, and analyze causes and effects of cascading events against a topology of a power system.

In some aspects, this disclosure describes a non-transitory computer-readable storage medium storing a suite of modules having executable code that, upon execution by a processor of a computing system, direct the computing system to perform operations. The suite of modules includes a first module that directs the computing system to assign a plurality of tasks across a cluster of computing nodes, where each task corresponds to a contingency of a power system. The suite of modules also includes a second module that directs the computing system to extract, from a database, data resulting from the cluster of computing nodes that perform analyses on simulations of the assigned plurality of tasks, where the data corresponds to impacts and likelihoods of contingencies and potential cascading events of the power system. The suite of modules also includes a third module that directs the computing system to present, through a graphical user interface of the computing device, a visualization of the impacts and likelihoods of contingencies and potential cascading events.

In other aspects, this disclosure describes a non-transitory computer-readable storage medium storing a suite of modules having executable code that, upon execution by a processor of the computing system, direct a computing system to perform operations. The suite of modules includes a first module that directs the computing system to perform a simulation corresponding to a task received from another computing system, where the task corresponds to a contingency of a power system. The suite of modules includes a second module that directs the computing system to perform an analysis on results of the simulation to identify impacts and likelihoods of contingencies and potential cascading events. The analysis includes an assessment of emergency controls of the power system and a calculation and coordination of protection element settings.

In yet other aspects, this disclosure describes a method performed by a computing system. The method includes performing, for a task corresponding to a contingency of a power system, a simulation and analyzing results of the simulation. Analyzing the results of the simulations includes calculating and coordinating protection element settings and using small-signal nomogram techniques to assess emergency controls of the power system. The method also includes, storing, in a database, the analyzed results.

NOMENCLATURE

CRM Computer-Readable Storage Medium
DCAT Dynamic Contingency and Analysis Tool
DVT DCAT Visualization Tool
DRAM Dynamic Random-Access Memory
HPC High-Performance Computing
MongoDB® Mongo Database
PSS®E Power System Simulation and Engineering
NVRAM Non-Volatile Random-Access Memory
RAS Remedial Action Schemes
RAM Random-Access Memory
ROM Read-Only Memory
SRAM Static Random-Access Memory
SPS Special Protection System
SSS Small-Signal Stability

DETAILED DESCRIPTION

The following description and the referenced drawings provide illustrative examples of that which the inventors regard as their invention. As such, the embodiments discussed herein are merely exemplary in nature and are not intended to limit the scope of the invention, or its protection, in any manner Rather, the description and illustration of these embodiments serve to enable a person of ordinary skill in the relevant art to practice the invention.

The following description includes an example mode of a preferred embodiment of the present disclosure. The use of "e.g.," "etc.," "for instance," "in example," "for example," and "or," as well as other grammatically related terms, indicates non-exclusive alternatives without limitation, unless the context clearly dictates otherwise. The use of "including" and other grammatically related terms means "including, but not limited to," unless the context clearly dictates otherwise. The use of the articles "a," "an," and "the" are meant to be interpreted as referring to the singular as well as the plural, unless the context clearly dictates otherwise. Words of approximation (e.g., "generally"), as used in context of the specification and figures, are intended to take on their ordinary and customary meanings which denote approximation, unless the context clearly dictates otherwise.

Figure 1:
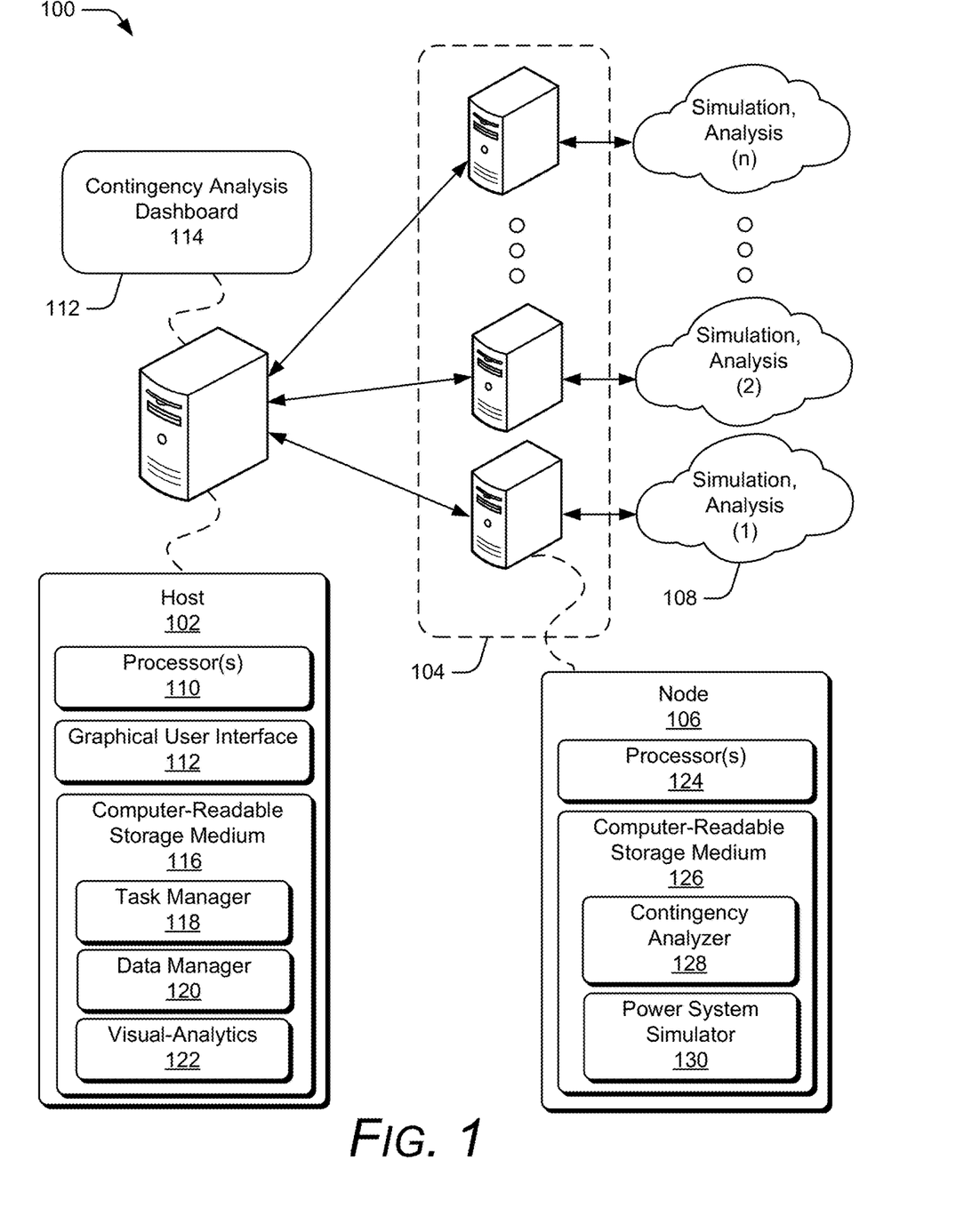
FIG. 1 illustrates an example operating environment using high-performance computing (HPC) techniques to simulate and analyze a power system in accordance with one or more aspects.

FIG. 1 illustrates an example operating environment 100 using high-performance computing (HPC) techniques to simulate and analyze a power system in accordance with one or more aspects. Within the operating environment 100, a host computing system 102 is configured to communicate with a cluster 104 of computing nodes. Each computing node (e.g., computing node 106) performs a simulation and analysis 108 of a contingency for the power system. Furthermore, the host computing system 102 and the computing node 106 may use different operating systems. As an example, the host computing system 102 may use a Windows® operating system and the computing node 106 may use a Linux® operating system.

The host computing system 102 includes one or more processors 110 and a graphical user interface (GUI) 112. The processor 110 may be a single-core processor or a multiple-core processor composed of a variety of materials, such as silicon, polysilicon, high-K dielectric, copper, and so on. The GUI 112 may be an interactive display that conveys information and represents actions taken by a user (e.g., an input to the host computing 102 made by the user through a mouse, a keyboard, and so on). The GUI 112 may also present a contingency-analysis dashboard 114.

The host computing system 102 also includes a non-transitory computer-readable storage medium (CRM) 116. The CRM 116 may include any suitable memory or storage device, such as random-access memory (RAM), static RAM (SRAM), dynamic RAM (DRAM), non-volatile RAM (NVRAM), read-only memory (ROM), or Flash memory. The CRM 116 stores a suite of modules having executable code that, when executed by the processor 110, direct the host computing system 102 to perform operations.

A first module includes a task manager 118 that directs the host computing system 102 to assign a plurality of tasks across the cluster 104 of computing nodes. Each task may correspond to a contingency of the power system. The task manager 118 may assign the plurality of tasks across the cluster 104 of computing nodes based on availabilities of computing nodes (e.g., availability of processors within each computing node 106) for optimal task allocation.

The first module may also include wrappers and/or compatibility layers that, in aggregate, allow the first module to be developed using one operating system and the first module (including the task manager 118) to be run using another, different operating system.

A second module includes a data manager 120 that directs the host computing system 102 to extract and store data from the cluster 104 of computing nodes performing simulations and analyses of the assigned plurality of tasks. The data may relate to contingencies and potential cascading events of the power system. Examples of such data include time-series data, relay trip sequences, relay trip summaries, remedial action schemes (RAS), special protection systems, corrective actions, and power flow cases. In some instances, the data manager 120 may include a database. The database may be, for example, a database that is supported by a MongoDB® engine.

A third module includes a visual-analytics tool 122 that directs the host computing system 102 to present, using the GUI 112, a visualization of impacts and likelihoods of contingencies and potential cascading events. The visualization may be presented through the contingency-analysis dashboard 114 using a combination of elements, such as an interactive table, a geo spatial map, or a time-series data chart. An example of the visual-analytics tool 122 includes the DCAT visualization tool (DVT) developed by Pacific Northwest National Laboratories. In some cases, the visual-analytics tool 122 may use JavaScript® libraries Leaflet and PixiJS.

The cluster 104 of computing nodes includes one or more computing nodes (e.g., one or more computing nodes 106). A computing node 106 includes one or more processors 124. The processor 124 may be a single-core processor or a multiple-core processor composed of a variety of materials, such as silicon, polysilicon, high-K dielectric, copper, and so on.

The computing node 106 also includes a non-transitory computer-readable storage medium (CRM) 126. The CRM 126 may include any suitable memory or storage device, such as random-access memory (RAM), static RAM (SRAM), dynamic RAM (DRAM), non-volatile RAM (NVRAM), read-only memory (ROM), or Flash memory. The CRM 126 stores executable code that includes a contingency analyzer 128 and a power system simulator 130. An example of the contingency analyzer 128 includes the Windows®-based Dynamic Contingency Analysis Tool (DCAT) developed by Pacific Northwest National Laboratories. An example of the power system simulator 130 includes the Power System Simulator for Engineering (PSS®E) developed by Siemens AG.

The cluster 104 of computing nodes (e.g., the processor 124 of each computing node 106 executing the contingency analyzer 128 and the power system simulator 130) may assess impacts and likelihoods of contingencies and potential cascading events across the power system. An example of the contingency analyzer 128 includes an open-platform, power system contingency-analysis tool known as a Dynamic Contingency Analysis Tool (DCAT) that has been developed to study the process of cascading outages. DCAT is an industry-grade tool that can interface with commercially available power system planning and analysis tools to combine steady-state and transient simulations, manual operator actions, and effects of protection systems to study the process of cascading outages.

Although FIG. 1 illustrates the cluster 104 of computing nodes as separate servers, the cluster 104 of computing nodes may take a variety of forms. For example, the cluster 104 of computing nodes may be a single server with a plurality of the processors 124. However, whether the cluster 104 of computing nodes includes separate servers or a single server, an HPC framework may apply. In general, the distribution of computing using the HPC techniques in the operating environment 100 renders improvements in computer-functionalities that are used to simulate and analyze a power grid.

Figure 2:
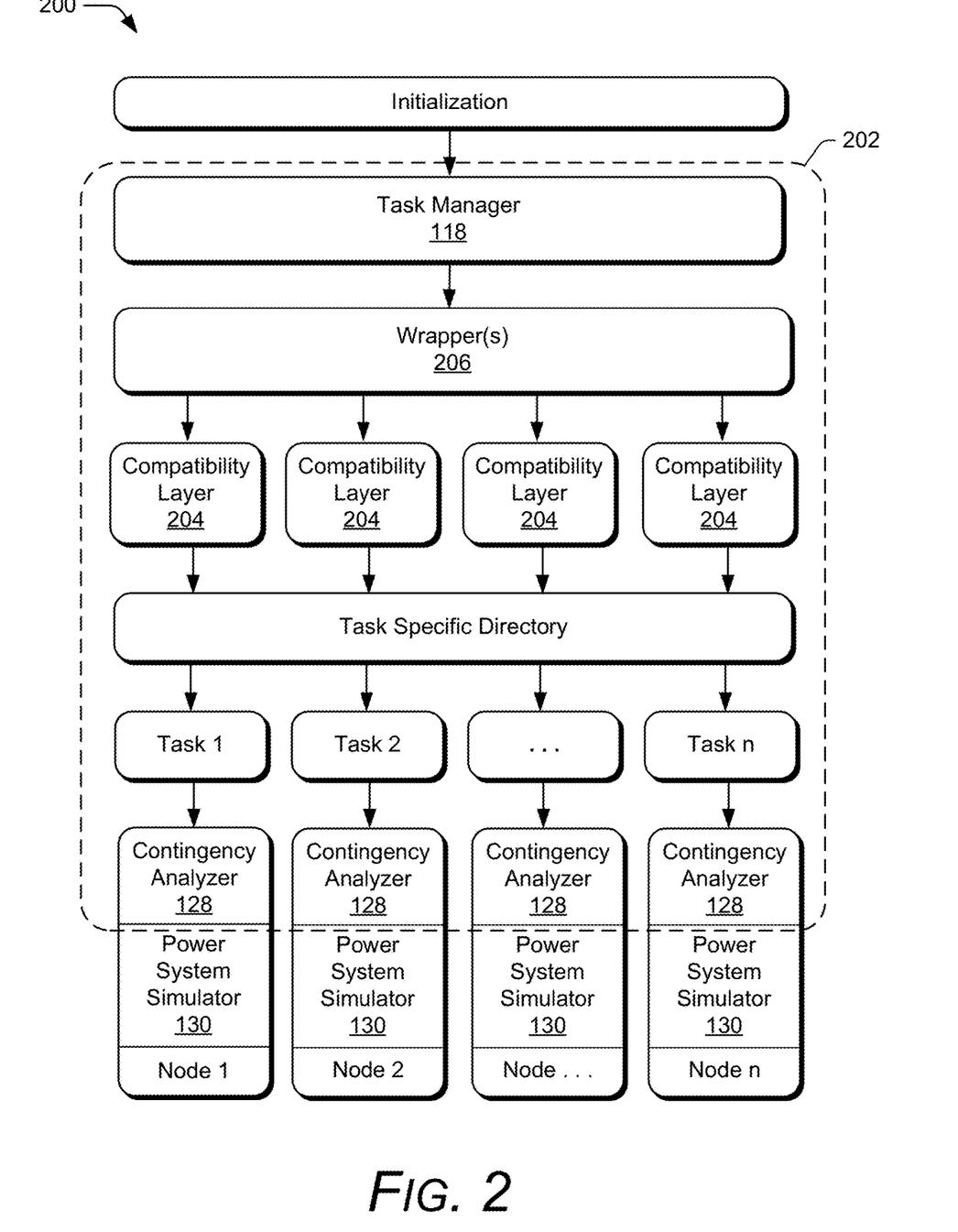
FIG. 2 illustrates example details of an HPC framework in accordance with one or more aspects.

FIG. 2 illustrates example details 200 of an HPC framework 202 in accordance with one or more aspects. FIG. 2 may incorporate aspects of the example operating environment 100 of FIG. 1, including the host computing system 102 and the cluster 104 of computing nodes.

The HPC framework 202 includes four main components. A first component of the HPC framework 202 includes the task manager 118. An example of the task manager 118 includes the GridPACK™ task manager, designed to parcel out computing tasks associated with power grid applications to one or more applications running in parallel. The task manager 118 assigns tasks to a processor (e.g., the processor 124 of the node 106) based on its availability. The task manager 118 may use a mechanism that is based on a read-modify-write functionality that enables the processor 124 to read a current value stored in a particular memory location of the processor 124 and then automatically increment that value. In this context, the mechanism may lock the memory location so that no other processor can read or modify the memory location until the processor 124 relinquishes the memory location. This enables users to create global counters that can supply a sequence of uniformly increasing task indices that are doled out to processors on a first-come, first-serve basis. Processors that may get a task that takes an unusually long time will get backfilled by other processors that run shorter tasks. This approach results in automatic load balancing.

A second component of the HPC framework 202 includes, for each computing node 106, a compatibility layer 204. An example of the compatibility layer 204 includes Wine, an open-source compatibility layer and runtime that enables running programming based in Microsoft® Windows® on Unix-like operating systems. Each compatibility layer 204 launches a simulation and analysis of a contingency of the power system using a processor of a computing node (e.g., the processor 110 of the computing node 106).

A third component of the HPC framework 202 includes the contingency analyzer 128 (e.g., DCAT). The contingency analyzer 128 may analyze results of simulations performed by the power system simulator 130 (e.g., PSS®E).

A fourth component of the HPC framework 202 includes wrapper(s) 206 to integrate the task manager 118, the compatibility layer 204, and the contingency analyzer 128. As an example, the wrappers may be Python® wrappers. Versions of the wrappers may, in some instances, be based on requirements of the power system simulator 130.

Figure 3:
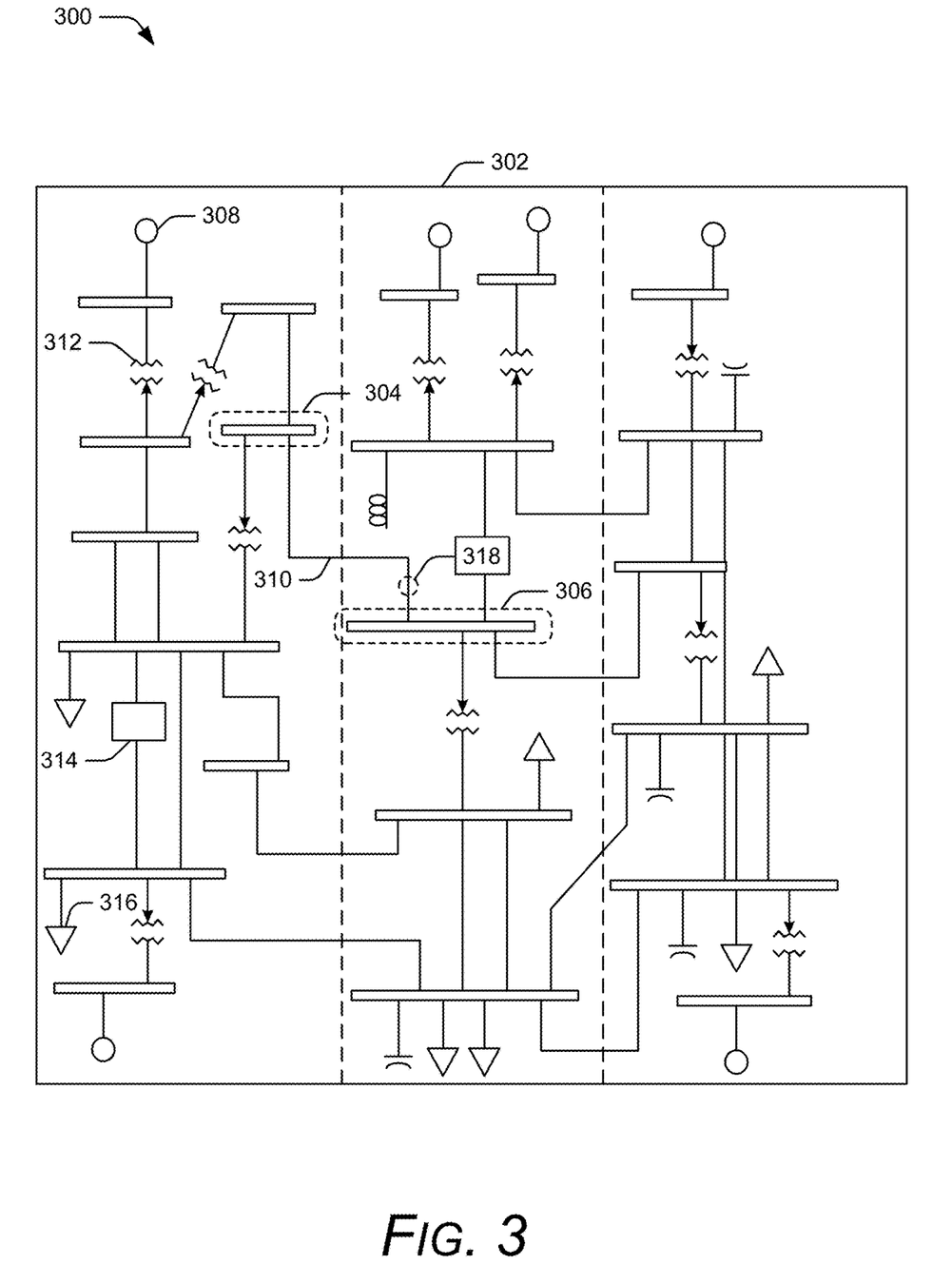
FIG. 3 illustrates an example model of a power system (e.g., a power grid) that a computing node may simulate and analyze in accordance with one or more aspects.

FIG. 3 illustrates an example model 300 of a power system 302 (e.g., a power grid) that a computing node may simulate and analyze in accordance with one or more aspects. The computing node may be the computing node 106 of FIG. 1 (e.g., the processor 124 executing the contingency analyzer 128 and the power system simulator 130). The computing node 106 may be functioning within the HPC framework 202 of FIG. 2.

In general, power system modeling may include a combination of power flow, dynamic, or protection system models. The example model 300 of FIG. 3 includes elements of the power system 302, such as buses (e.g., bus 304 and bus 306), generators (e.g., generator 308), transmission lines (e.g., transmission line 310), transformers (e.g., transformer 312), substations (e.g., substation 314), and loads (e.g., load 316). Using variants of the model 300 as prepared by a power-planning engineer, the computing node 106 may simulate and analyze events that might be disruptive to the power system 302. For example, a power-planning engineer may initiate an event that is a fault (e.g., a contingency) impacting the transmission line 310 connecting the bus 304 to the bus 306. Examples include a 3-phase line fault, a 3-phase bus fault for ten cycles, a 3-phase bus fault for twelve cycles, and so on.

For the computing node 106 to simulate and analyze the event, the power-planning engineer may alter the model 300 to include a fictitious node 318 along the transmission line 310. After the power-planning engineer has altered the model 300 to include the fictitious node 318 (and applied the event that is a fault), the computing node 106 may simulate and analyze the event.

While simulating the event, the computing node 106 (e.g., the processor 124 executing the power system simulator 130) may run a dynamic simulation long enough to capture a response of the power system 302. The computing node 106 (e.g., the processor 124 executing the contingency analyzer 128) may then analyze simulation results and log sequences of cascading events.

Enhanced analysis techniques may be applied to simulation results that include, for example, calculating and coordinating protection element settings of the model 300 using small-signal nomogram modeling to assess emergency controls of the model 300.

The model 300 may include protection elements that are relays. Post-dynamic analysis for corrective actions (e.g., Remedial Action Schemes (RAS)/Special Protection Systems (SPS)) may rely on undervoltage, overvoltage, underfrequency, and overfrequency relays. Furthermore, respective relays may use different, respective settings (e.g., relay-protection settings). Examples of relay-protection settings include zone reach (per-unit), zone pickup time (cycles), zone centerline angle (degrees), and zone center distance (per-unit). In the context of relay-protection settings for power systems, per-unit (pu) may refer to a voltage, current, or other unit of power measurement.

Enhanced analysis techniques that calculate and coordinate relay-protection settings may include a series of sub-operations that include (i) receiving power flow and sequence network data, (ii) determining, using the received power flow and sequence data, a plurality of relay-protection settings, (iii) organizing, using the determined plurality of relay-protection settings, a protected line and relay coverage table (iv) identifying, using the protected line and relay coverage table, over-reaching relays (e.g., relays that trip faults beyond a protection zone), and (v) coordinating, by adding pickup up time delays to the identified over-reaching relays, the plurality of relay-protection settings.

An example protected line and relay coverage table used as part of advanced analysis techniques is illustrated in Table 1 below:

TABLE 1

| Protected Line | Relay 1 | Relay 2 | ... | Relay n |
|---|---|---|---|---|
| Line 1 (from - to) | 1 | 0 | | 1 |
| Line 1 (to - from) | 0 | 1 | | 0 |
| Line 2 (from - to) | 0 | 1 | | 0 |
| ... | | | | |
| Line k (to - from) | 1 | 0 | | 0 |

The protected line and relay coverage table is organized in a protected line-oriented manner for a zone (e.g., for the protected lines of Table 1, Relay 1, Relay 2, and Relay n may be "zone-3" relays that provide remote backup protection for an adjacent transmission line). When a line at a row i is protected by a relay at column j, the corresponding value at the cell (i,j) will be 1, otherwise it is 0. Because direction should be considered in distance protection, one transmission line has two records (in two rows) in the table. To prepare and fill out the table, line open-end faults are applied to each protected line (one end at each time). The apparent electrical impedance viewed at each relay location will be used to check against a relay setting to determine whether the line is protected by the relays.

The table (Table 1) lends itself to coordinating the relays through several steps. Firstly, for each protected line record in the table, summing the row yields the total number of relays capable of providing backup protection to the line. If the number is zero, it means there is no zone protection capable of providing backup for the line in the defined direction. Secondly, for each column of relay records in the table, if there is one non-zero entry, where the corresponding protected transmission line is not adjacent to the transmission line where the relay is installed, the relay is over-reaching to the protected transmission line. Third, for those over-reaching relays, their reach and/or pickup stings should be adjusted to make sure they do not trip for an out-of-zone fault.

An example coordinated relay-protection setting table used as part of advanced analysis techniques is illustrated in Table 2 below:

TABLE 2

| | Zone Protections | | |
|---|---|---|---|
| Setting | Installed at bus for line 148-178 | Installed at bus for line 177-178 | Installed at bus for line 179-178 |
| Zone reach (p.u.) | 0.73 | 0.57 | 1.58 |
| Zone pickup time (cycles) | 95 | 95 | 95 |
| Zone centerline angle (degrees) | 71.08 | 75.31 | 74.97 |
| Zone center distance (p.u.) | 0.37 | 0.28 | 0.79 |

The relay-protection setting table may include additional information, such as security limits defined by a load encroachment or a blinder.

As mentioned above, the cluster 104 of computing nodes analyzing results of the simulations may include assessing emergency controls of the power system Enhanced analysis techniques that assess emergency controls of the power system may include using nomogram techniques that analyze small-signal stability (SSS) of the power system. Small-signal stability (SSS) refers to an ability of the power system to maintain synchronism after a minor disturbance. If the power system is not small-signal stable, oscillations between groups of generators in different parts of the power system will grow in magnitude until protective devices engage.

In analyzing SSS of a power system, a state matrix is of key importance. The state matrix essential describes how states of the power system (e.g., voltage magnitudes and angles) vary over time. The state matrix, like any square matrix, can be characterized by a set of scalars and vectors known as eigenvalues and eigenvectors. The eigenvalues are directly related to system stability and, being complex values, are composed of real and imaginary components. If the real components of all eigenvalues are less than zero, the power system is small-signal stable. If, however, the real component of one or more eigenvalues is greater than zero, the system is unstable. In this way, the SSS of a system is determined by the system state matrix.

To relate system inputs, such as power transfer through critical grid interfaces to the SSS boundary, nomogram techniques may be used. In accordance with the techniques, nomogram specifies the region that a particular system input may occupy while maintaining SSS. For example, a two-dimensional nomogram could correspond to power transfer along two transmission corridors. As long as the operating point, which specifies the power flow through the two transmission corridors remains within the nomogram, the power system will maintain stability. A margin for stability may be given as a distance, in terms of power flow along the corridors, for a boundary of the nomogram.

An example state matrix for the power system may rely on the following mathematical relationship:

$$A_s = A - BD^{-1}C \quad (1)$$

In the mathematical relationship (1), A, B, C, and D represent Jacobean matrices. The system state matrix (e.g., $A_s$) is obtained by eliminating algebraic variables.

Monte Carlo simulations may be used for qualitative determination of stable regions with respect to small signal disturbances. The system state matrices for all the realizations of the Monte Carlo are computed and solved for complex eigenvalues and corresponding eigenvectors. For a given realization of the Monte Carlo samples, the power system is considered stable if none of the eigenvalues has a positive real part. Using a two-dimensional plot, as a function of randomly varying loads, stable and unstable regions may be delineated to further investigate if control devices (e.g., power system stabilizers) are required to maintain stability of the power system.

Figure 4:
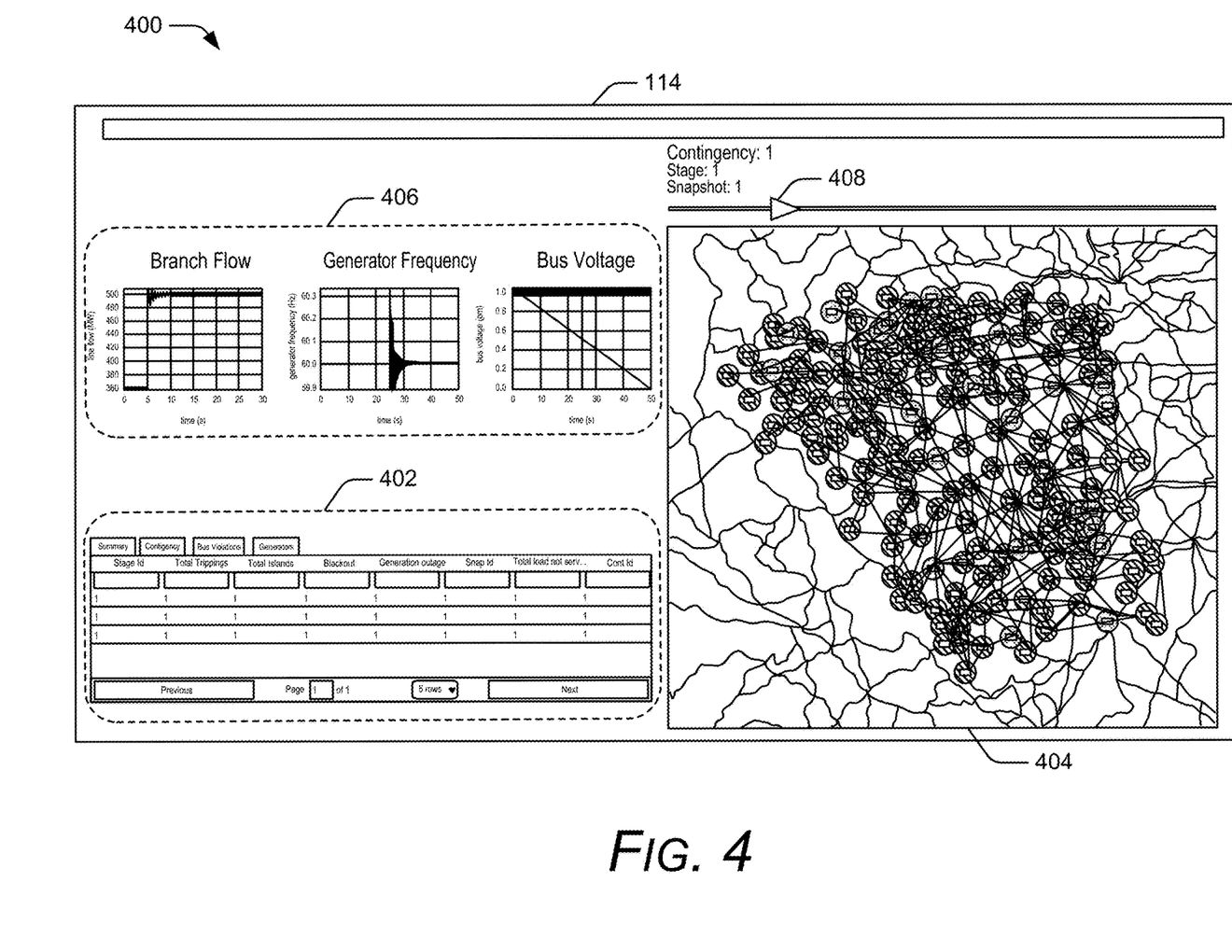
FIG. 4 illustrates details of an example graphical user interface (GUI) presenting an example contingency-analysis dashboard in accordance with one or more aspects.

FIG. 4 illustrates details 400 of an example graphical user interface (GUI) presenting an example contingency-analysis dashboard in accordance with one or more aspects. The GUI may be the GUI 112 of FIG. 1 and the contingency-analysis dashboard may be the contingency-analysis dashboard 114 of FIG. 1. The contingency-analysis dashboard 114 may be a web-based dashboard that affords power-planning engineers a visualization situational environment to better comprehend, interpret, and analyze contingency-analysis data and results to more directly view behaviors and causes and effects against a topology of a power system (e.g., a power grid).

The processor 110 executing the visual-analytics tool 122 of FIG. 1 may direct the host computing system 102 to present the contingency-analysis dashboard 114 using the GUI 112. The visual-analytics tool 122 may be based on a Windows® Presentation Foundation (WPF) framework that can access a database (e.g., the database in the data manager 120). In an alternative instance, the visual-analytics tool 122 may be implemented using a backend server and a front-end client hosted in a web server. In such an instance, the backend server may load data associated with power-system simulation and analysis onto the front end-client that presents a visualization of the data.

As illustrated in FIG. 4, the contingency-analysis dashboard 114 includes an interactive table 402, a geospatial map 404, and time-series data charts 406. The interactive table 402 may present various summary statistics and violations for outages, transmission line contingencies, bus violations, and generators.

A power-planning engineer may use the geospatial map 404 to examine a layout of the power system and current state of the power system's various components. The various components include nodes (load buses, generators, or unknown) and transmission lines for a given contingency. Within the geospatial map 404, various components of the power system may be represented using various symbols. As an example, a load bus may be represented using a rectangle, a generator may be represented using an upside-down triangle, and an unknown node may be represented using a circle. Furthermore, states of the power system's various components may be color-coded. As an example, a node that is in violation of a normal voltage may be represented using a red color, while another node that is not in violation may be represented using a grey color.

In some instances, the geospatial map 404 may include a heatmap. As an example, a blurred circle surrounding a node may reveal an extent of an over or under-voltage in a generator or a load bus. The geospatial map 404 may also include animation capabilities to visualize the progression of cascading effects and behaviors within the power system. Such animation may allow for incremental analysis to more easily discern spatiotemporal patterns within the power system. In some instances, animation within the geospatial map 404 may be controlled through a slide bar 408 (e.g., a user may "slide" the slide bar 408 across a time span to view events cascading across the power system).

The time-series data charts 406 present visualizations of several aspects of the power system analysis. Examples of the time-series data charts 406 include (i) a branch flow chart that illustrates transmission line flows in MegaWatts (MW) during a tripping of the transmission line (e.g., the transmission line may carry a fault current of the power system), (ii) a generator frequency chart that illustrates frequencies in Hertz (Hz) of a generator during the tripping of the transmission line, and (iii) a bus voltage chart that illustrates load bus voltages per unit (pu) during the tripping of the transmission line.

Figure 5:
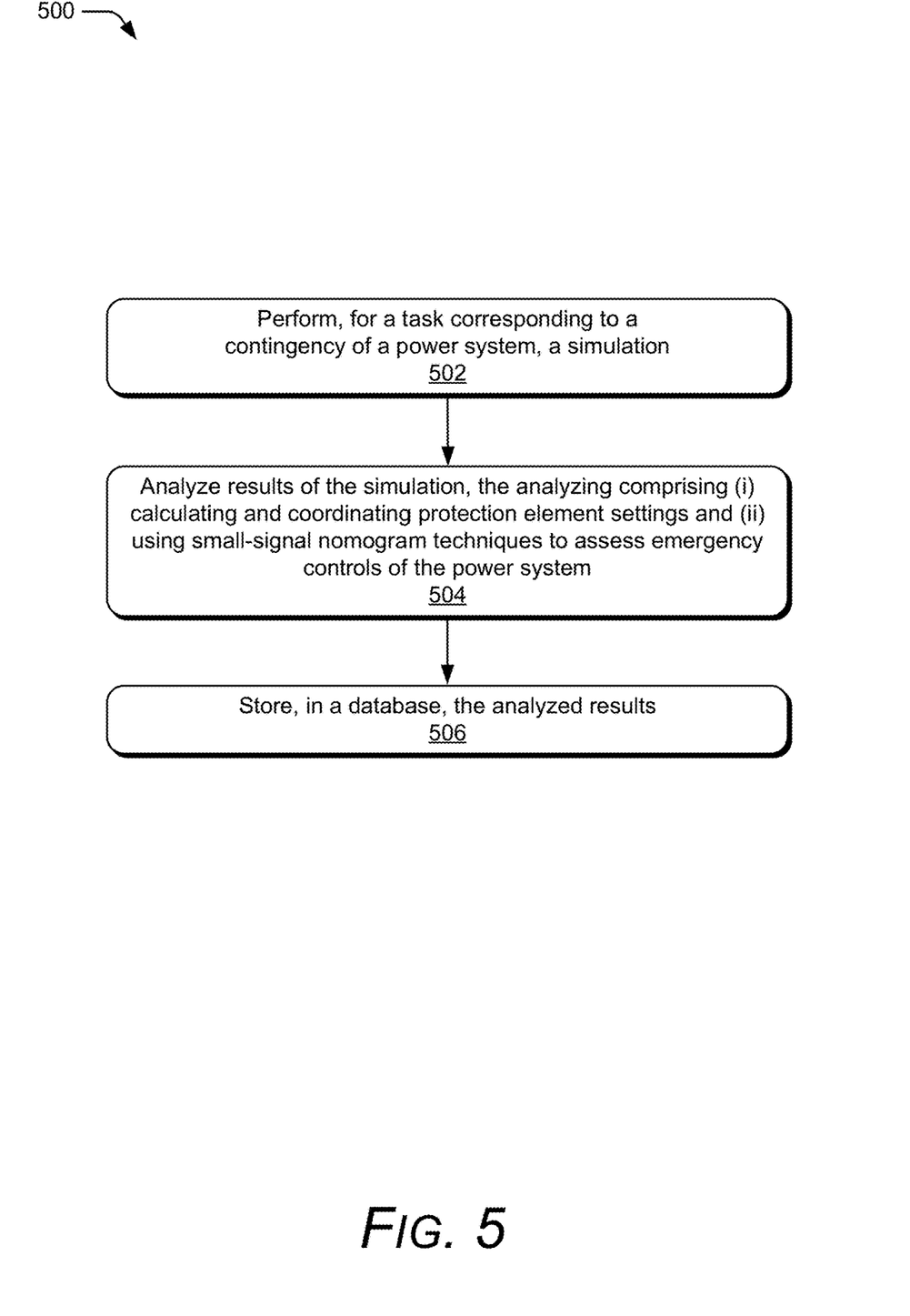
FIG. 5 illustrates an example method of performed by a computing system in accordance with one or more aspects.

FIG. 5 illustrates an example method 500 performed by a computing system in accordance with one or more aspects. The series of operational blocks 502-506 that describe the method are not to be construed as a limitation, as one or more of the described operational blocks 502-506 can be combined using different elements or ordering to implement the method 500 or an alternate, derivative method. Furthermore, although described in the context of being performed by the computing node 106 of FIG. 1, portions of the method 500 may be divided or allocated across multiple computing systems. The method 500 may use elements of FIGS. 1-4.

At operation 502, the computing system (e.g., the processor 124 executing the power system simulator 130) performs a simulation. The simulation may be for a task corresponding to a contingency of a power system (e.g., the power system 302 of FIG. 3). In some instances, at operation 502, the task may be received from another computing system (e.g., the host computing system 102).

At operation 504, the computing system (e.g., the processor 124 executing the contingency analyzer 128) analyzes results of the simulation performed at operation 502. In some instances, at operation 504, analyzing the results of the simulation may include an assessment of emergency controls of the power system. Assessing the emergency controls of the system may use small-signal nomograph techniques and may include using eigenvalues of a state matrix of the power system. Also, in some instances at operation 504, analyzing the results of the simulation may include a calculation and coordination of protection element settings.

At operation 506, the computing system stores the analyzed results in a database. In some instances, the database may be in a CRM of the computing system (e.g., the CRM 126 of the computing node 106). In other instances, the database may be in another CRM of another computing system (e.g., the CRM of the host computing system 102).

Figure 6:
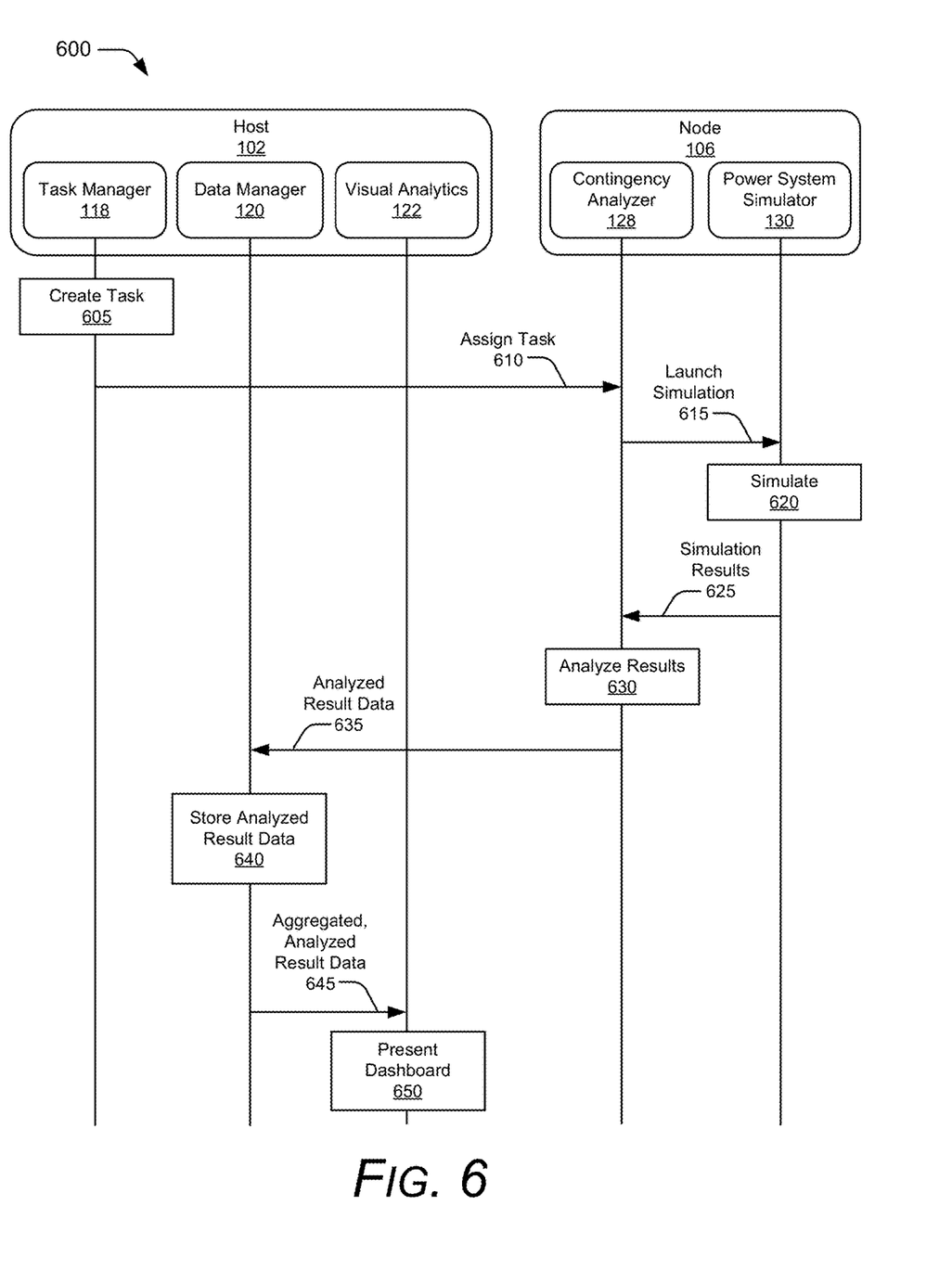
FIG. 6 illustrates an example transaction diagram in accordance with one or more aspects.

FIG. 6 illustrates an example transaction diagram 600 in accordance with one or more aspects. The illustrated transaction may be amongst elements of FIG. 1, including the host computing system 102 (e.g., the task manager 118, the data manager 120, the visual-analytics tool 122) and the computing node 106 (e.g., the contingency analyzer 128, the power system simulator 130). In some instances, a transaction may be associated to a specific protocol or call function of a specific module (e.g., the task manager 118, the data manager 120, the visual-analytics tool 122, the contingency analyzer 128, the power system simulator 130).

At 605, the host computing system 102 (e.g., the processor 110 executing the task manager 118) creates a task for a contingency of a power system. After creating the task, and at 610, the host computing system sends a command that assigns the task to the computing node 106 (e.g., the processor 124 executing the contingency analyzer 128). At 615, the computing node 106 (e.g., the processor 124 executing the contingency analyzer 128) sends a command that, at 620, launches a simulation of the contingency at the computing node (e.g., the processor 124 executing the power system simulator 130).

At 625, the computing node 106 (e.g., the processor 124 executing the power system simulator 130) renders results of the simulation for analysis. At 630, the computing node 106 (e.g., the processor 124 executing the contingency analyzer 128) analyzes the simulation results and generates data that corresponds to impacts and likelihoods of contingencies and potential cascading events of the power system. Examples of analyzed simulation-results data include dynamic data such as time-series data for monitored simulation variables, relay trip sequences, or relay trip summaries. Analyzed simulation-results data may also include steady-state date such as remedial action schemes, special protection systems, corrective actions, or power flow cases.

At 635, the computing node 106 transfers the analyzed simulation-results data to the data manager 120 (e.g., a database within the data manager 120) of the host computing system 102. At 640, the host computing system 102 (e.g., the processor 110 executing data manager 120) stores the analyzed simulation-results data. Also at 640, the host computing system 102 may store analyzed simulation-results data from other computing nodes (e.g., other computing nodes of the cluster 104 simulating other contingencies based on other tasks).

At 645, the host computing system 102 (e.g., the processor 110 executing the visual-analytics tool 122) extracts aggregated data (e.g., data based on stored, analyzed simulation-results data from the cluster 104 of computing nodes) from the data manager 120. In some instances, extracting the data may be in response to a query input to the host computing system 102 by a user (e.g., a power-planning engineer).

At 650, the host computing system 102 (e.g., the processor 110 executing the visual-analytics tool) presents a contingency-analysis dashboard (e.g., the contingency-analysis dashboard 114).

The foregoing detailed description provides exemplary embodiments of the invention and includes the best mode for practicing the invention. The description and illustration of these embodiments is intended only to provide examples of the invention, and not to limit the scope of the invention, or its protection, in any manner.

What is claimed is:

1. A computing system comprising:
   a processor; and
   a non-transitory computer-readable storage medium storing a suite of modules having executable code that, when executed by a processor, direct the computing system to perform operations, the suite of modules comprising:
   a first module that directs the computing system to assign a plurality of tasks across a cluster of computing nodes, each task corresponding to a contingency of a power system, wherein the first module further directs the computing system to assign the plurality of tasks across the cluster of computing nodes based on respective availabilities of computing nodes amongst the cluster of computing nodes;
   a second module that directs the computing system to extract, from a database, data resulting from the cluster of computing nodes performing analyses on simulations of the assigned plurality of tasks, the data corresponding to impacts and likelihoods of contingencies and potential cascading events of the power system; and
   a third module that directs the computing system to present, through a graphical user interface of the computing system, a visualization of the impacts and likelihoods of contingencies and potential cascading events.

2. The computing system as recited in claim 1, wherein the data corresponding to impacts and likelihoods of contingencies and potential cascading events of the power system includes at least one of:
   time-series data for monitored simulation variables;
   relay trip sequences;
   relay trip summaries;
   remedial action schemes;
   special protection systems;
   corrective actions; or
   power flow cases.

3. The computing system as recited in claim 1, wherein the third module directs the computing system to present, through the graphical user interface, a contingency-analysis dashboard that includes at least one of a geospatial map, an interactive table, or time-series data charts.

4. The computing system as recited in claim 3, wherein the interactive table includes summary statistics and violations for at least one of:
   outages;
   transmission line contingencies;
   bus violations; or
   generators.

5. The computing system as recited in claim 3, wherein the geospatial map comprises a heatmap.

6. The computing system as recited in claim 3, wherein the time-series data charts comprise at least one of a branch flow chart, a generator frequency chart, or a bus voltage chart.

7. The computing system as recited in claim 3, wherein the geospatial map includes nodes and transmission lines for a given contingency.

8. The computing system as recited in claim 3, wherein the contingency-analysis dashboard is a web-based dashboard.

9. The computing system of claim 1, further comprising:
   a second computing system, the second computing system comprising:
   a second processor; and
   a second non-transitory computer-readable storage medium storing a second suite of modules having executable code that, when executed by the second processor, direct the second computing system to perform operations, the second suite of modules comprising:
   a fourth module that directs the second computing system to perform a simulation corresponding to a task received from the computing system, the task corresponding to a contingency of the power system; and
   a fifth module that directs the second computing system to perform an analysis on results of the simulation to identify impacts and likelihoods of contingencies and potential cascading events, the analysis including:
   an assessment of emergency controls of the power system; and
   a calculation and coordination of protection element settings.

10. The computing system of claim 9, wherein the plurality of tasks are assigned across a cluster of computing nodes of the second computing system.

11. The computing system as recited in claim 1, wherein the first module further includes at least one of wrappers or compatibility layers that, in aggregate, allow the first module to be developed using one operating system and allow the first module to be run using another, different operating system.

12. A computing system comprising:
a processor; and
a non-transitory computer-readable storage medium storing a suite of modules having executable code that, when executed by the processor, direct the computing system to perform operations, the suite of modules comprising:
a first module that directs the computing system to perform a simulation corresponding to a task received from another computing system, the task corresponding to a contingency of a power system; and
a second module that directs the computing system to perform an analysis on results of the simulation to identify impacts and likelihoods of contingencies and potential cascading events, the analysis including:
an assessment of emergency controls of the power system; and
a calculation and coordination of protection element settings.

13. The computing system as recited in claim 12, wherein small-signal nomogram techniques are used to perform the assessment of the emergency controls of the power system.

14. The computing system as recited in claim 13, wherein the small-signal nomogram techniques includes using eigenvalues of a state matrix of the power system.

15. The computing system as recited in claim 12, wherein the calculation and coordination of the protection element settings comprises:
receiving power flow and sequence network data;
determining, using the received power flow and sequence data, a plurality of relay-protection settings;
organizing, using the determined plurality of relay-protection settings, a protected line and relay coverage table;
identifying, using the protected line and relay coverage table, over-reaching relays; and
coordinating, by adding pickup up time delays to the identified over-reaching relays, the plurality of relay-protection settings.

16. A method performed by a computing system, the method comprising:
performing, for a task corresponding to a contingency of a power system, a simulation;
analyzing results of the simulation, the analyzing of the results comprising:
calculating and coordinating protection element settings by:
receiving power flow and sequence network data;
determining, using the received power flow and sequence data, a plurality of relay-protection settings;
organizing, using the determined plurality of relay-protection settings, a protected line and relay coverage table;
identifying, using the protected line and relay coverage table, over-reaching relays; and
coordinating, by adding pickup up time delays to the identified over-reaching relays, the plurality of relay-protection settings; and
assessing emergency controls of the power system, the assessing of the emergency controls comprising:
analyzing the small-signal stability of the power system using small-signal nomogram techniques; and
storing, in a database, the analyzed results.

17. The method as recited in claim 16, wherein analyzing the small-signal stability of the power system using the small-signal nomogram techniques to assess emergency controls of the power system further comprises:
using eigenvalues of a state matrix of the power system.

18. The method as recited in claim 16, further comprising performing Monte Carlo simulations to make a qualitative determination of stable regions with respect to small signal disturbances.

19. The method as recited in claim 16, further comprising receiving the task from another computing system.

20. The method as recited in claim 16, wherein storing the analyzed results in a database includes storing analyzed results in a computer-readable medium of the computing system.

21. The method as recited in claim 16, wherein storing the analyzed results in a database includes storing the analyzed results in a computer-readable medium of another computing system.

* * * * *